United States Patent [19]
Clemen et al.

[11] Patent Number: 5,796,284
[45] Date of Patent: Aug. 18, 1998

[54] HIGH-PRECISION VOLTAGE DEPENDENT TIMING DELAY CIRCUIT

[75] Inventors: Rainer Clemen, Böblingen; Wolfdieter Loehlein, Herrenberg; Harald Mielich, Stuttgart, all of Germany

[73] Assignee: International Business Machines Corporation, Armonk, N.Y.

[21] Appl. No.: 765,416
[22] PCT Filed: Jul. 31, 1995
[86] PCT No.: PCT/EP95/03041
§ 371 Date: Dec. 16, 1996
§ 102(e) Date: Dec. 16, 1996
[87] PCT Pub. No.: WO97/05700
PCT Pub. Date: Feb. 13, 1997
[51] Int. Cl.⁶ .................................. H03H 11/26
[52] U.S. Cl. .......................... 327/264; 327/263
[58] Field of Search .............................. 327/263, 264, 327/276, 277, 278, 281, 261, 51, 52, 54, 55, 53, 57, 333

[56] References Cited

U.S. PATENT DOCUMENTS

| | | | |
|---|---|---|---|
| 4,894,791 | 1/1990 | Jiang et al. | 327/276 |
| 5,164,621 | 11/1992 | Miyamoto | 327/264 |
| 5,192,916 | 3/1993 | Glass | 327/157 |
| 5,341,045 | 8/1994 | Almulla | 327/333 |
| 5,446,417 | 8/1995 | Korhonen et al. | 327/276 |

*Primary Examiner*—Toan Tran
*Attorney, Agent, or Firm*—Marc A. Ehrlich; Bernard M. Goldman

[57] ABSTRACT

For high-speed single-ended sensing of the small signal delivered from a (static) RAM or ROM cell, a voltage dependent timing delay circuit is disclosed which prevents early triggering of the set signal of the sense amplifier (SSA 66) when applying a high voltage screen test (i.e. 1.5 times $V_{DD}$) to the cell. The timing of the SSA signal is achieved by a high precision delay chain comprising inverters, which is loaded by a voltage dependent current sink (70) coupled to the output of the chain. The inverter delay chain controls the input (SE0) for a driver for the SSA line (66). The current sink may be a pull down NFET (70) which is only activated when the supply voltage is above a determined switching threshold therefor. The gate voltage of the NFET is controlled by a bias control circuit (72) in such a manner that during operation at typical voltage levels, the NFET is deactivated, whereas at higher operating voltage levels (such as $1.5 * V_{DD}$) the NFET is turned on, thereby sinking current from the input (SE0) to the driver for the SSA line. The SSA signal is consequently delayed preventing the early triggering thereof.

17 Claims, 7 Drawing Sheets

HIGH-PRECISION VOLTAGE DEPENDENT TIMING DELAY CIRCUIT

The invention concerns a timing delay circuit, particularly for high-speed sensing of signals from a RAM or ROM cell which comprises word lines and bit lines. The invention is further directed to a sensing scheme for memory arrays, in particular to the timing of differential sense amplifiers which sense and amplify signals developed on the respective single bit lines. The proposed circuit and method are particularly relevant to semiconductor memory devices such as dynamic and static random-access memory devices (DRAMs, SRAMs).

High speed random-access memories (RAMS) implemented in complementary metal-oxide semiconductor (CMOS) technology comprise minimum size memory cells which require special circuitry to sense and amplify the small signals delivered by the cells when selected for read operations. Such sense circuits need to be timed precisely so that these signals can be detected reliably. This especially applies for DRAMs using only a one-device cell as storage element, which involves single-ended sensing. But high density multi-port static RAMs (SRAMs) usually permit only single-ended sensing, too, because the memory cell must be minimized with respect to the number of transistors and I/O wiring. For example, a n-port SRAM cell with n data-out ports contains n I/O transistors and n bit lines.

In case of single-ended sensing, each memory cell is connected to a differential sense amplifier via a single bit line (FIG. 6). Hereby the sense amplifier is activated by a 'set sense amplifier' (SSA) signal which timing is critical, especially when the supply voltage Vdd of the memory cell is shifted. In conventional, previously known approaches, inverter chains are used to generate the required SSA delay from the leading edge of a SRAM input clock signal.

These circuit schemes are disadvantageous in that said delay varies depending on CMOS process parameters and the applied conditions, like supply voltage and operation temperature. A major problem is that circuit functionality and performance strongly depend on the supply voltage of these circuits.

In particular, it is practically impossible to design these circuits for a wide range of supply voltages, for example from 3.3 to 5.0 V as required for low-power and battery applications, without losing performance at the low-voltage corner. One reason for the considerable loss of performance at high-voltage operations is that at the design point of the sense amplifier chosen to be at Vdd=3.4 V, the sense amplifier transistors and the timing conditions are tuned for maximum performance at this supply voltage, and therefore a change of the supply voltage towards much higher voltages will shift away those conditions from the optimum operating point of the sense amplifier. Thereupon at high voltage conditions, the timing chain runs too fast, and thus the sense amplifier might already be set before a large enough voltage difference has been established.

Furthermore, CMOS product testing requires high-voltage screens and burn-in conditions to ensure reliable circuit operation in the field. For the CMOS4S products recently developed by the present assignee, the challenge is to design a circuit which is fully functional at 5.1 V voltage screen and burn-in conditions, without sacrificing performance at normal system operations where the supply voltage ranges between 3.4 and 3.8 V.

In an article by W. Cordaro, F. D. Jones and R. S. Mao published in the IBM Technical Disclosure Bulletin (TDB), Vol. 26, No. 10B (March 1984), a hardware arrangement to speed up the access time of conventional memory cells comprising word lines and bit lines and a differential sense amplifier is disclosed, particularly described is a delay technique which employs a sense latch triggering circuit with a clock driver comprising a threshold voltage to prevent premature triggering at higher supply voltages.

Further, an article by H. H. Chao and L. M. Terman in IBM TDB, Vol. 25, No. 10 (March 1983), and an article by S. E. Schuster in IBM TDB, Vol. 19, No. 2 (July 1976), are also, more or less, related to the problem of wordline delay with respect to the bit line in a memory cell. The latter article particularly concerns a sense amplifier suitable for memory sensing, which provides self-compensation with regard to parameter and supply voltage variations.

Another approach concerning the above subject of timing delay between the activation of word lines and the setting of the corresponding sense amplifiers in a memory device is disclosed in U.S. patent application Ser. No. 08/319,898 (docket no. BU-9-94-035), assigned to the present assignee. Due to the variation of inverter based clocking signals as a function of process and temperature, and with the aim of guaranteeing sufficient timing delay also at high-voltage conditions, the proposed solution provides a clocking circuit with an increasing timing delay as the supply voltage vdd increases. This time/voltage characteristic is provided by a capacitive load for storing an amount of charge that varies with supply voltage Vdd.

Those previously known approaches are disadvantageous insofar as they do not provide high performance in the whole Vdd regime. Especially the proposed solution in the above U.S. patent application does not have a high performance particularly in the low-level regime due to the constant capacitive load.

The major objective addressed by the present invention, therefore, relates to the above discussed improvement of the functionality, and therefore of the performance, of timing delay circuits in the whole regime of supply voltages.

The invention as claimed solves this problem by changing magnitude and slope of the timing signal, so that in a following circuit with a switching threshold, the switching point is reached later, and thus an enhanced timing delay is achieved.

Use of a current sink or current source depends on the output signal of the delay chain, whether a rising or falling edge needs to be delayed. The switching point of the current sink/source can be precisely adjusted by using a voltage dependent control voltage. This control voltage can be generated by inserting a number of diodes between the supply voltage Vdd and the control input of the current sink/source. By way of introducing a clock signal, the current sink/source can be activated and deactivated within determined time periods, in order to save power, for example.

By use of the proposed delay circuit in a memory array, the problem underlying the invention is solved by introducing a voltage dependent delay circuit in the delay chain for the timing signal of the sense amplifier. This special circuit can be designed to counteract the delay reduction which would be obtained in a conventional timing chain, e.g. an inverter chain, when the supply voltage Vdd is raised. Implementation of the proposed circuit in a memory device therefore permits operation of that device even at extremely different supply voltages, wherein the delay circuit can be precisely adjusted by the respective diodes in the path between the supply voltage Vdd and the threshold voltage of the current sink/source according to the invention.

The high-precision delay circuit herein proposed and claimed is further insofar advantageous over the prior art approaches insofar as it provides shorter access times for read-out operations because the sense amplifier can be timed aggressively with minimum SSA delay. The magnitude and the slope of the timing signal can be automatically adjusted for the applied supply voltage. Thus it guarantees functionality of the memory cell in an extremely broad voltage range, even if the timing delay is optimized or minimized, respectively, for a high-performance sense and read operation at a minimum supply voltage Vdd.

In conclusion, the proposed voltage dependent timing chain provides the optimum design point for high-speed SRAM operation at Vdd≦3.6 V, and functionality at high voltages up to 6 V. It enables minimization of the worst case access time at the low-voltage corner, without having to add extra margin for high or excessive voltages at best case conditions, with minimum effective channel lengths of the FETs.

These and other features, aspects and advantages of the present invention over the prior art solutions will be apparent from the following detailed description and the claims, by way of preferred embodiment, and with reference to the drawing, where FIG. 1 is a schematic block diagram depicting a delay chain as in the state of the art;

Figure 1:
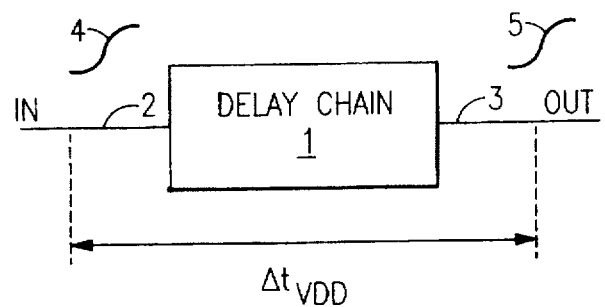

FIG. 1 shows a timing delay chain 1 with an input 2 and an output 3 which is implemented by a conventional chain of inverters. Due to the signal response times of the respective inverters, a timing delay is produced between the input signal 4 and the output signal 5.

Figure 2:
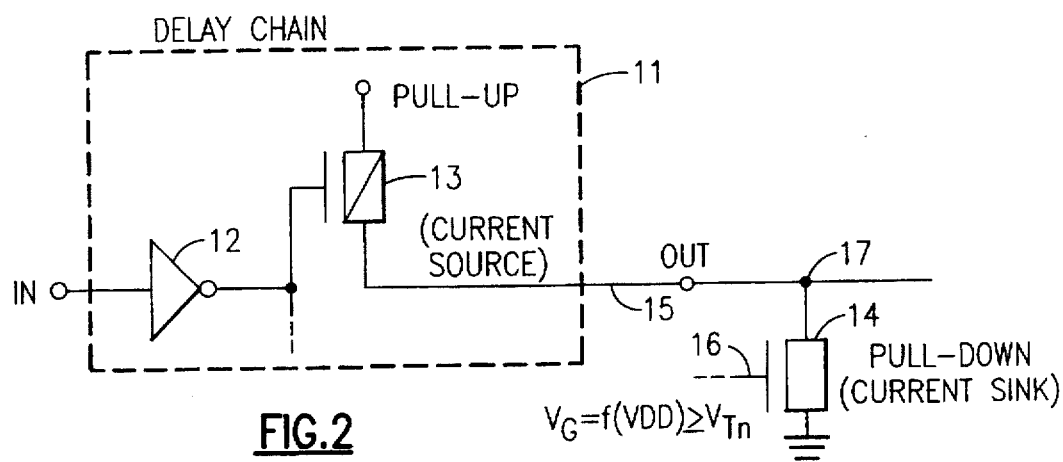
FIG. 2 is a schematic block diagram like in FIG. 1 where a current sink according to the present invention is connected to the output of a delay chain.

The corresponding delay chain 11 depicted in FIG. 2 comprises a single inverter chain 12. At the output stage of the delay chain 11, a current source 13 with a pull-up voltage behaviour is provided. Due to the response times of the devices 12 and 13, the input and output signal comprise a delay which is dependent on the supply voltage Vdd of the circuit.

According to the present invention, a (pull-down) current sink 14 is connected to the output stage 15 of the delay chain 11. In the preferred embodiment of the invention, the current sink is a switching NMOS field effect transistor (FET) which is controlled by a voltage applied to its gate 16. The voltage $V_G$, as illustrated, varies as a function of the supply voltage $V_{DD}$ and is greater than or equal to the threshold voltage $V_{Tn}$ for the NMOS-FET. If the MOS-FET switches on, the current sink 14 counteracts the current source 13 which has the effect that the slope of the signal is increased and the output signal amplitude at node 17 is reduced. It is emphasized that the switching means for providing a current sink/source according to the invention can be also implemented by all kinds of known switching devices, like relays or semi-conductor switches.

Figure 3:
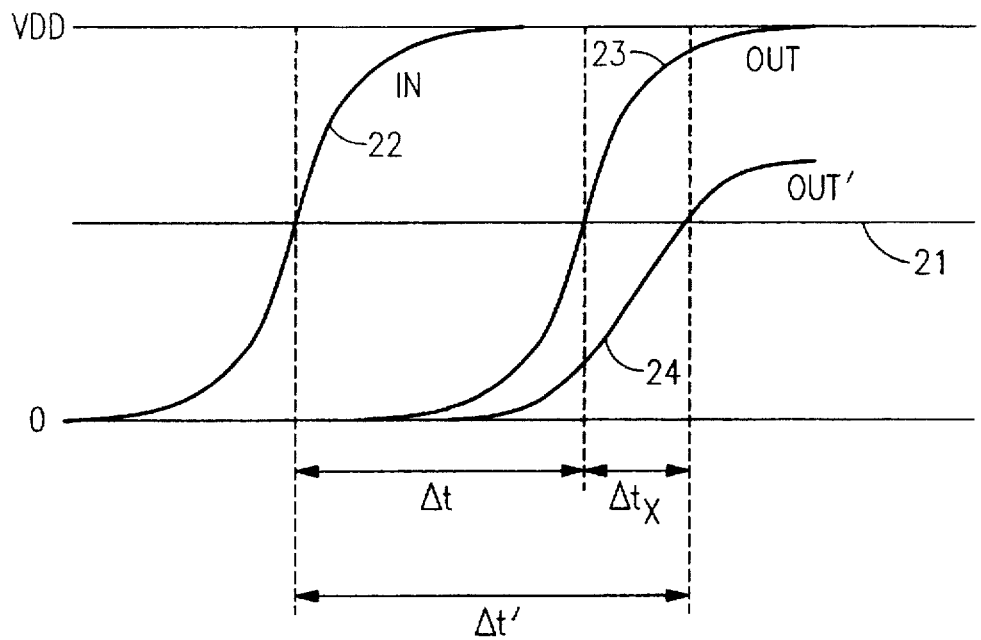
FIG. 3 is a timing chart for illustration of the method according to the present invention, for producing an additional timing delay with respect to a conventional delay chain.

With regard to FIG. 3 it is shown, how this signal drop leads to an additional delay Δtx. It is hereby assumed that a switching device with a threshold voltage $V_{Tn}$ is connected to an output node 17 of the inverter chain 12 shown in FIG. 2. This switching threshold is depicted in FIG. 3 as line 21. To the input stage of the delay chain 11, an input signal 22 is applied. The corresponding output signal 23 is delivered at the output stage 15 of the delay chain 11 and comprises a delay Δt for the above reasons. If the current sink 14 is active, the output signal 23 is lowered resulting in a signal 24. From FIG. 3 it can be understood that this voltage drop has the consequence that the switching threshold 21 is reached at a later time Δt', resulting in an additional delay Δtx.

Figure 4A:
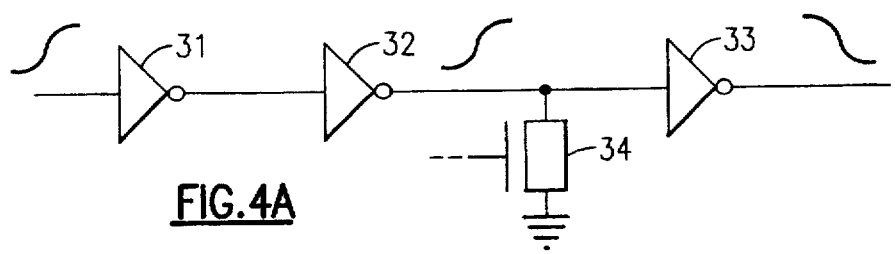
FIG. 4a and 4b depict a circuit arrangement according to the present invention where a current sink is connected to two different stages of a conventional delay chain, for the cases of two different input signal edges.
Figure 4B:
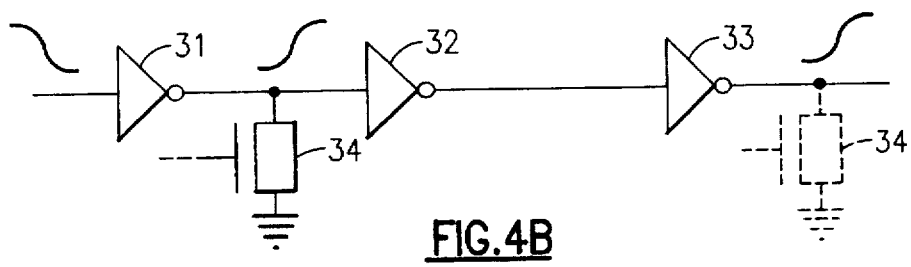

FIG. 4a shows an embodiment of a delay chain with three inverters 31, 32, 33 where the timing delay means according to the present invention is connected to an output of the second inverter 32. It is noted that these means can be also connected to the outputs of inverter 31 or inverter 33, respectively, if the down-going edge of the input of the delay chain needs to be delayed (FIG. 4b). For both cases shown in FIG. 4a and 4b, where the switching means according to the present invention is connected to a node of the delay chain being pulled-up, a current sink 34 has to be implemented in order to counteract the pull-up device. It is further noted that in FIG. 4b, the timing delay means can be connected to the delay chain either on the left side or the right side.

Figure 5:
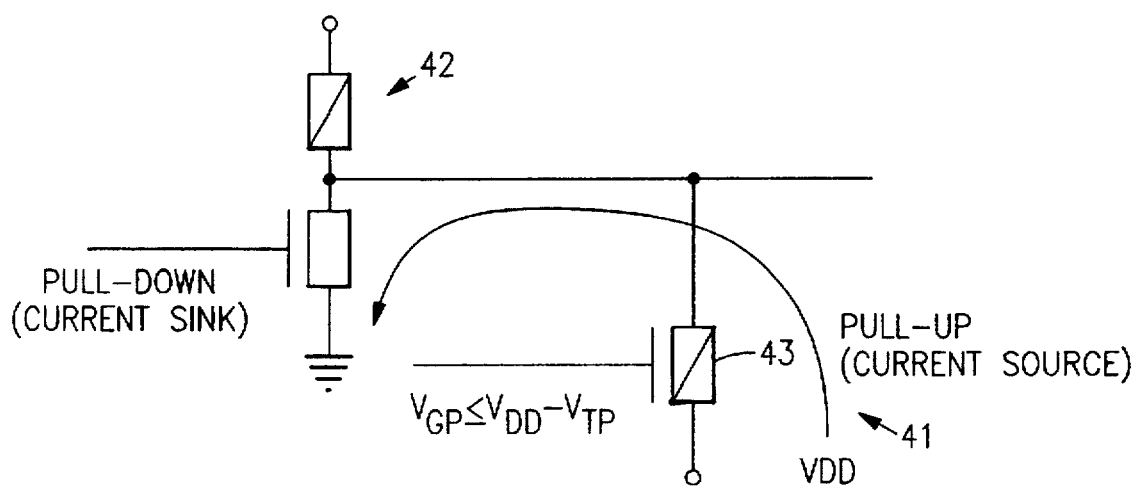
FIG. 5 shows a complementary circuit arrangement with respect to FIG. 2 comprising a current source according to the present invention.

A possible implementation of a complementary switching means 41 is shown in FIG. 5. Hereby a current source 41 is added to an output node 42 of a delay chain (not shown) which is pulled-down by the respective stage of the delay chain. The current source is represented by a PMOS-FET 43 which switches when the gate voltage of the PMOS falls well below the difference value of the supply voltage Vdd and the threshold voltage of the PMOS-FET VTp.

Figure 6:
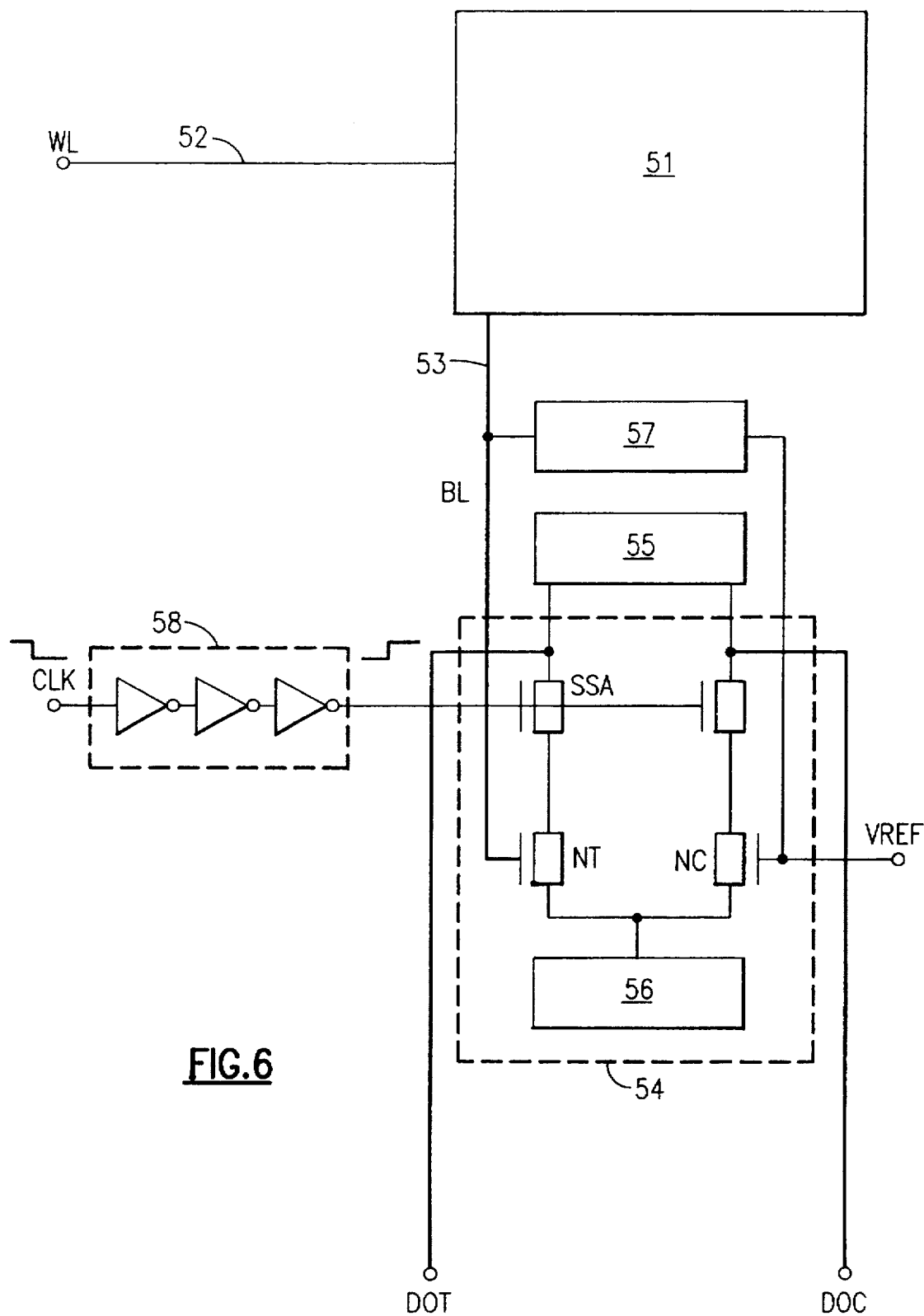
FIG. 6 shows a conventional CMOS embodiment of a sensing scheme with single-ended sensing, where a memory cell is connected to a differential sense amplifier via a single bit line.

FIG. 6 shows a conventional CMOS embodiment for a sensing scheme with single-ended sensing of a memory cell 51 in a memory array as known in the prior art. The memory cell 51 comprises a word line 52 and a single bit line 53. When selected, it delivers a sense signal via bit line 53 to a conventional differential sense amplifier 54. The sense amplifier 54 is powered by a supply voltage Vdd via a load device 55, where the produced current can be adjusted by a current source 56. By means of a precharge device 57, the bit line 53 is precharged high to a voltage Vref, usually below the supply voltage Vdd, which is also used as reference voltage for the sense amplifier 54.

The sense amplifier 54 can be activated by a 'set sense amplifier' (SSA) signal which is delivered by a conventional timing delay chain 58 comprising a chain of three inverters in this embodiment. The output and the input signals of the delay chain 58 are delayed relatively to each other. The delay varies, depending on the CMOS process parameters and applied conditions, such as supply voltage and temperature.

Before an activation of the sense amplifier 54, the bit line must be discharged by the memory cell 51 well below Vref.

Thus, the SSA timing is critical, especially if the supply voltage Vdd and thus the reference and bit line voltages are shifted. In this conventional approach, the inverter chain is used to generate the required SSA signal from the leading edge of an input clock signal.

The major problem with this circuit scheme is that the functionality and performance depends on the reference voltage Vref and thus on the supply voltage Vdd. If the design point of the sense amplifier is chosen to be at Vdd=3.4 V and the sense amplifier transistors and the timing are tuned for maximum performance at this supply voltage, then a 5 V operation will at least be marginal, since both the bit line and the reference voltage are shifted towards much higher voltages-away from the optimum operating point of the sense amplifier. In addition, at such a high voltage, the timing chain runs too fast and the sense amplifier might already be set before a large enough voltage difference of the bit line and the reference voltage has been established.

Figure 7:
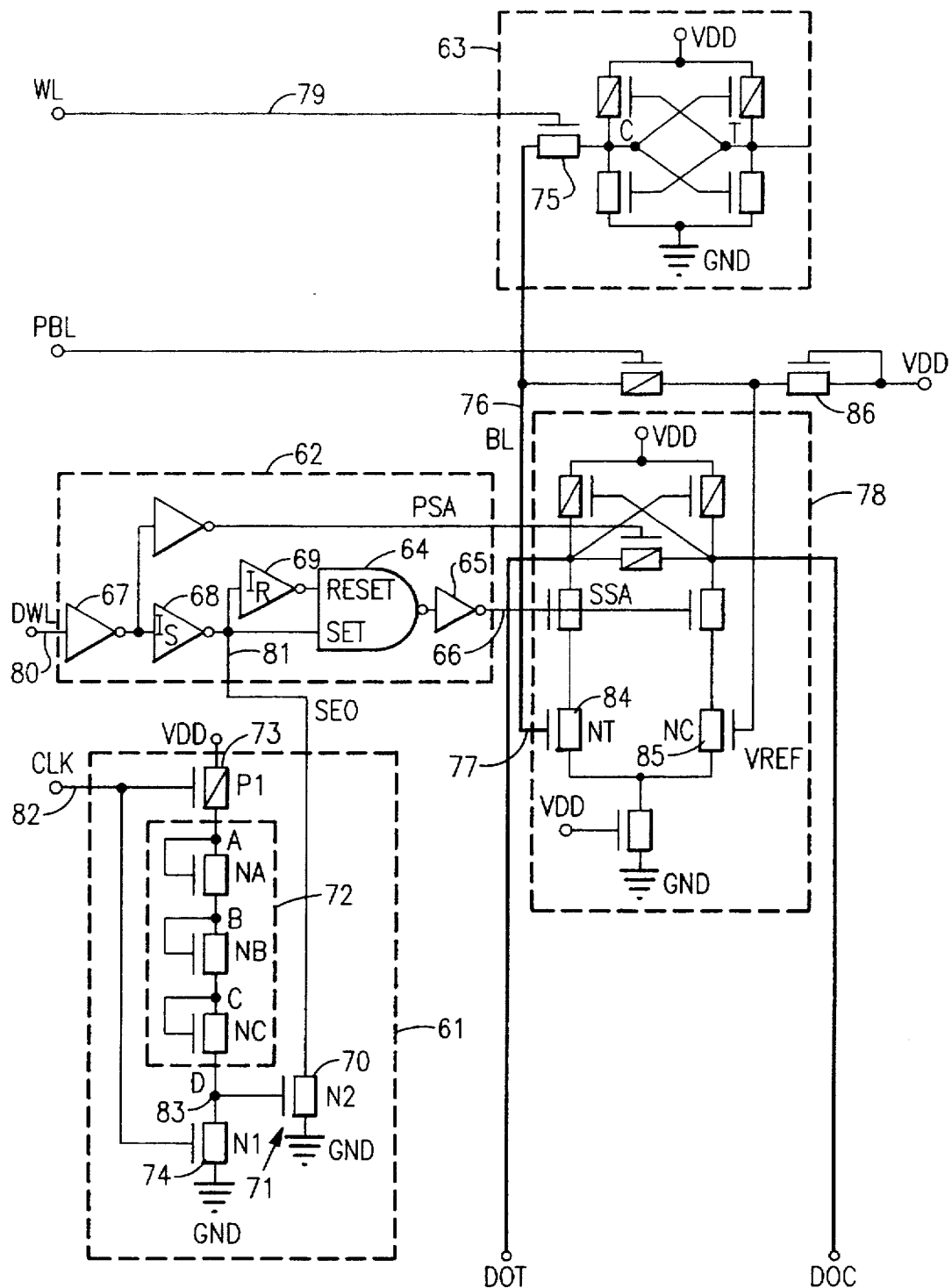
FIG. 7 shows an embodiment of a sensing scheme of FIG. 6, comprising a voltage dependent delay circuit in the timing chain for a sense amplifier set signal.

To resolve the tradeoff between the required high-performance operation at normal voltages, e.g. around 3.6 V, and functionality at high-voltage screens, a preferred embodiment of the delay circuit according to the invention shown in FIG. 7, comprising a voltage dependent delay circuit 61, is introduced in the timing chain 62 for the SSA signal. This special circuit can be designed to counteract the delay reduction which occurs in a conventional delay (inverter) chain as depicted in FIG. 6 when the supply voltage Vdd is raised.

The CMOS embodiment of the proposed circuit 61, 62 shown in FIG. 7 for single-ended sensing in a fast multi-port SRAM 63 features a 2-way NAND gate 64 followed by an inverting buffer 65 to drive the SSA line 66. The set input (SE0) of the NAND gate 64 is connected to a non-inverting delay chain of inverters 67, 68 which is triggered from a dummy (=sample) word line signal DWL. A reset input which initiates the deactivation of the SSA signal, is fed by another inverter chain 69 (IR), which is also fed by the set signal SE0.

The magnitude and the slope of the set signal SE0 can be precisely adjusted by the voltage dependent delay circuit 61. It contains a pull-down transistor 70 (N2) which acts as a current sink for a pMOS load transistor 13 (FIG. 2) of the setting inverter 68 (IS). The current through the pull-down transistor 70 (N2) is controlled by the gate voltage of N2. The gate 71 is driven by a particular pull-up/pull-down circuit 72 which contains a series connection of NMOS transistors (NA, NB, NC) in the pull-up path. These transistors can be substituted by conventional diodes or transistors, where appropriate. Each of these NMOS transistors has the gate and the drain interconnected to form a diode. Thus, the gate voltage of N2 can be adjusted by the number of NMOS diodes inserted in the path 72 between the pMOS pull-up transistor 73 and the gate 71 of the current sink N2. It is noted that these diodes can be also implemented by conventional bipolar diodes.

For normal operation at 3.6 V, three NMOS diodes each producing a voltage drop of about 1 V (threshold voltage) are sufficient to ensure that the current sink 70 (N2), with a threshold voltage of about 0.6 V, remains just turned off. In case of a 5 V operation, however, N2 is turned on so that a significant current is provided to prevent the set node SE0 to rise too rapidly and too high. As already described above, the SSA signal is consequently delayed.

In this embodiment, a clock signal (CLK) controls the gate 71 of the current sink 70 via NMOS transistor 74 (N1). If the clock signal is low, transistor 73 pulls up the gate 71 via the three NMOS diodes, thus getting a delay curve 23 in FIG. 3. When the clock returns to the high level, transistor 74 pulls down the gate 71 to ground level and causes the current sink 70 to be deactivated.

In a further advantageous embodiment, the current sink 70 (N2) has a larger current drive capability as the PMOS transistor of inverter stage 68 (IS). For example, a channel width of 24 µm for N2 and 22.5 µm for the PMOS inverter stage are optimum device sizes.

It should be noted that the method according to the present invention depends on use of NMOS or PMOS technology for the transistor N2. In case of an NMOS implementation, the current sink is only activated when the gate voltage is larger than a threshold voltage of about 0.6 V, but it becomes not active when said gate voltage is close to the threshold voltage.

Otherwise, in case of a PMOS implementation, N2 is only activated when the gate voltage becomes smaller than the difference between the supply voltage and the threshold voltage, but it will not switch when the gate voltage is close to that difference.

Figure 12:
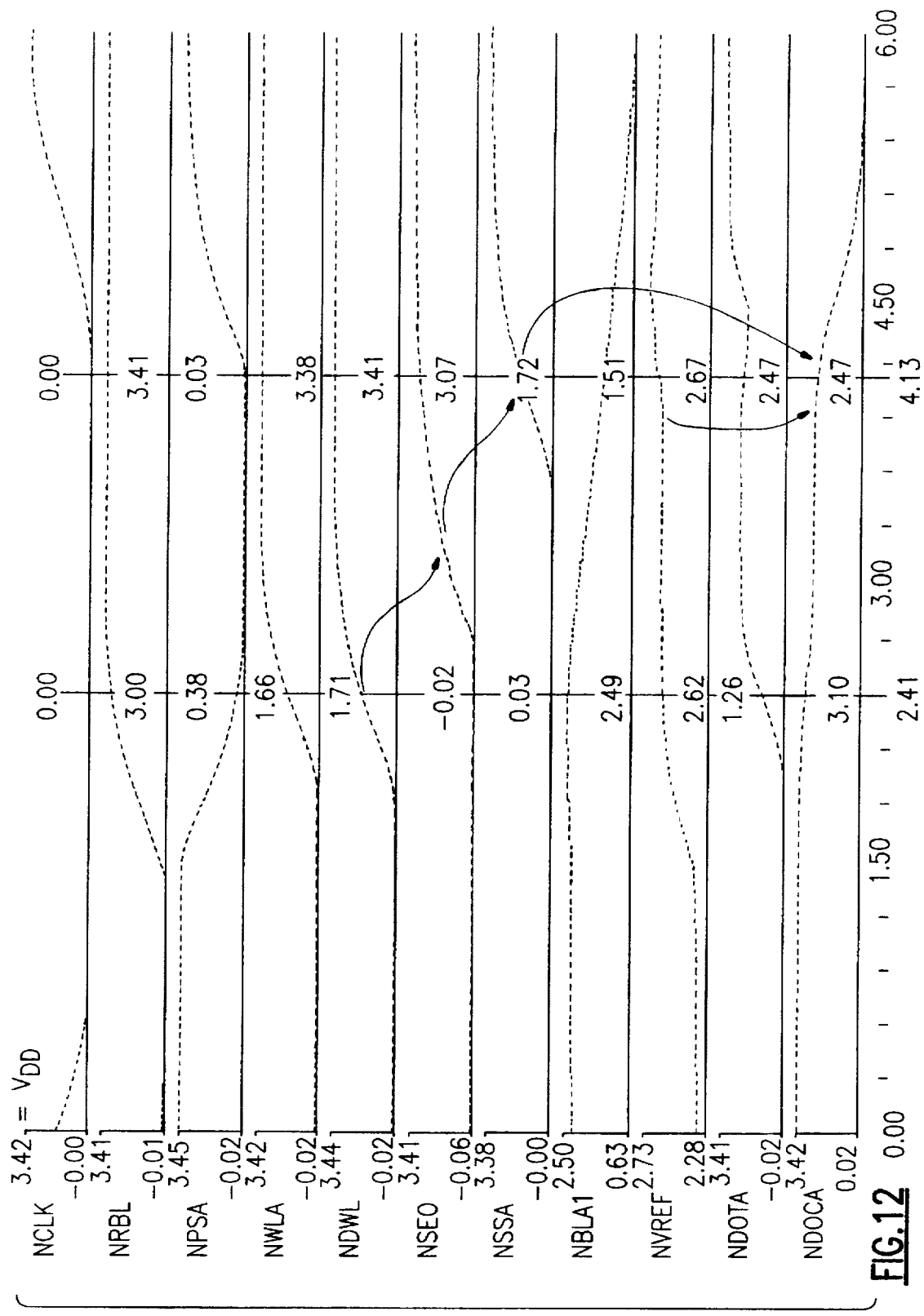
FIG. 12 is a timing chart depicting all relevant signal states during operation of a delay circuit according to FIG. 7.

Referring now to the circuit scheme shown in FIG. 7 and the basic timing diagram in FIG. 12, the read operation of the sensing scheme is as follows.

It is assumed that a logical '1' is stored in the memory cell, with node T being high and node C low. It is further assumed that the bit line BL has been precharged to a reference voltage Vref=Vdd–VTn, wherein VTn is the threshold voltage of the NMOS transistors 86. The bit line signal has been going low in the previous cycle.

At the beginning of the cycle, the sense amplifier outputs DOT and DOC are equalized by the precharge signal PSA. When the (Read) word line WL rises, the read-port NMOS transistor 75 of the memory cell is turned on and pulls down the bit line 76 (BL), creating a signal at the input 77 of the sense amplifier 78. During this time, the sense amplifier 78 must not be activated, that is, SSA must be kept low.

Simultaneously with a word line 79 (WL), a dummy word line signal 80 (DWL) is brought high to trigger the timing chain which produces a set signal 81 (SE0). Depending on the required delay for reliable sensing of the BL signal 76, this chain consists of several inverter stages 67, 68 where stage 68 (IS) is the last one.

Already at the beginning of the cycle, the PMOS pull-up transistor 73 (P1) is turned on by the SRAM enable clock 82 (CLK) going low. This causes the node 83 (D) to rise to Vdd–3*Vtn. Due to the substrate bias effect, the NMOS threshold voltage is about 1 V for a 0.8 µm CMOS technology and this application. In case of a system operation with a supply voltage of Vdd≦3.6 V, the voltage at node D is too small (about 0.6 V) to turn on N2 enough, to impact the rising edge of SE0.

Then the signal SE0 propagates through the 2-way NAND gate 64 and the output inverter 65 drives the SSA signal 66, timed to arrive at the earliest possible point where the sense amplifier 78 can be activated for high-speed operation. The current difference between NMOS transistors 84, 85 (NT, NC) is sensed and amplified, so that complementary data output DOC goes low, whereas the true output DOT goes high.

During a voltage screen or stress with Vdd=6 V, the gate voltage at N2 would be about 3 V (=6 V–3 V), which is high enough to turn on the current sink N2 significantly. Thereby a voltage divider between the PMOS output transistor of inverter IS and N2 is established. Consequently the signal SE0 is prevented from rising too fast and does not reach the full up-level.

Reading a logical '0'(i.e. memory cell node C high), the bit line BL remains high at Vref. When the sense amplifier is set by SSA, the NMOS transistor NT (L=0.8 µm) conducts more current than the long-channel transistor NC (L=1.3 µm) on the complementary side. Consequently, sense amplifier output DOT goes low, whereas DOC goes high.

The circuits shown in FIG. 6 and 7 were compared by ASTAP simulation of a 128×108-bit two-port SRAM macro (Cache Directory) implemented in a CMOS4S technology by the present assignee. The obtained ASTAP waveforms are plotted in FIG. 8, 9 and FIG. 10, 11, respectively.

Figure 8:
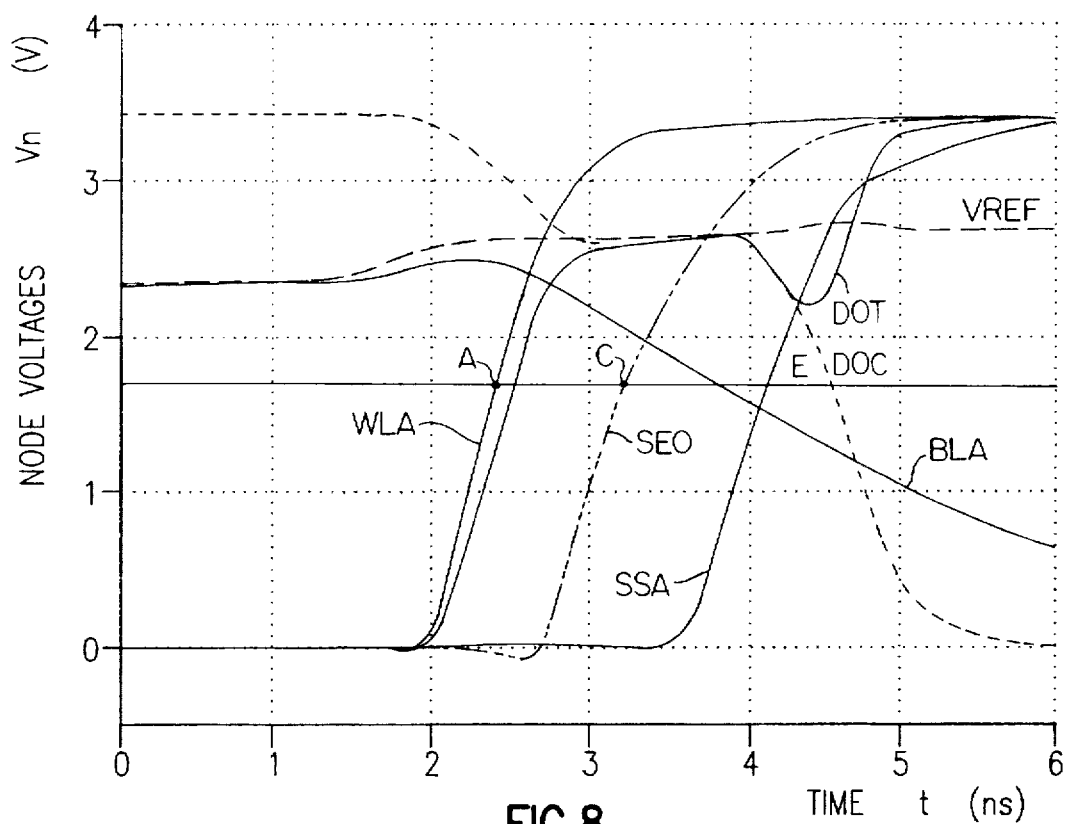
FIG. 8–11 depict functional timing charts for operation of the circuits according to FIG. 6 and 7, at respectively two different supply voltage levels.
Figure 9:
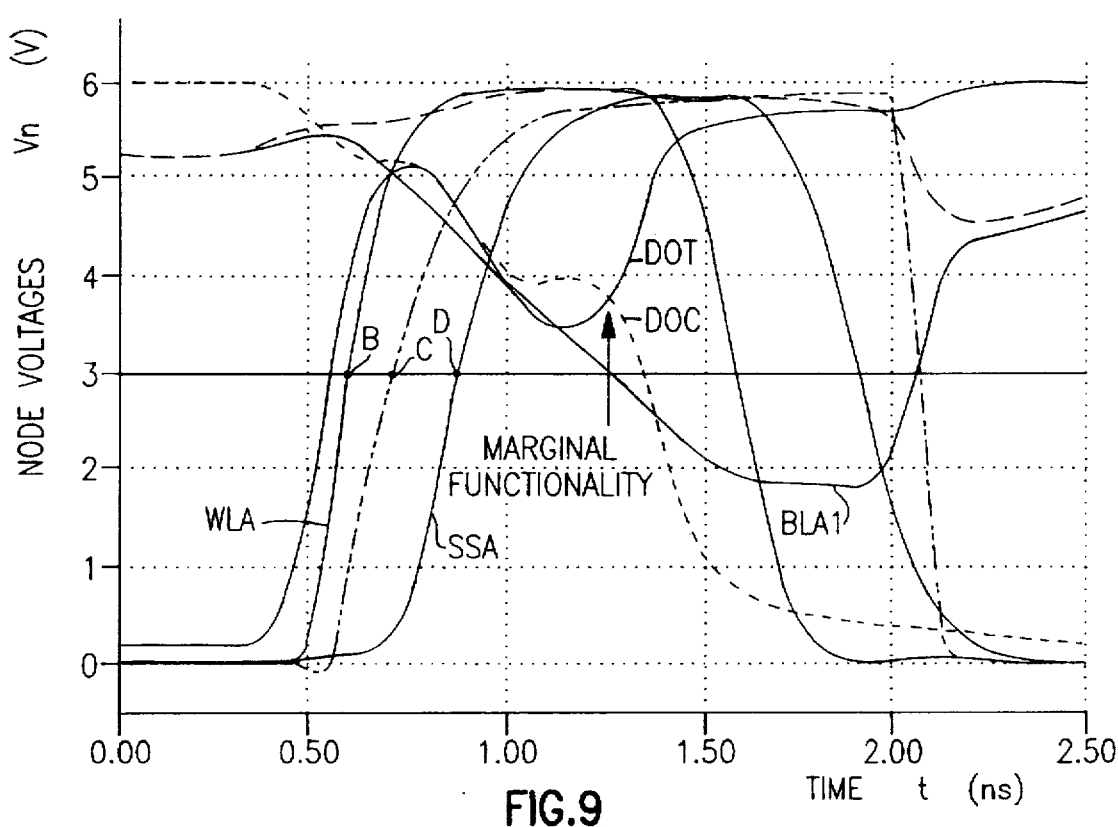

FIG. 8 shows the worst case performance of a state-of-the-art sensing scheme at a minimum supply voltage Vdd= 3.42 V (3.6 V–8%), wherein FIG. 9 shows the best case performance of a state-of-the-art sensing scheme at maximum screen voltage Vdd=6 V. These plots prove that the voltage dependent timing delay circuit does not impact the SSA delay and the access time at the low voltage corner (3.4 V), as the SSA signal arrives at the same time.

From FIG. 9 it is obvious that the timing is very marginal at 6 V, because the sense amplifier output DOT drops too far.

Figure 10:
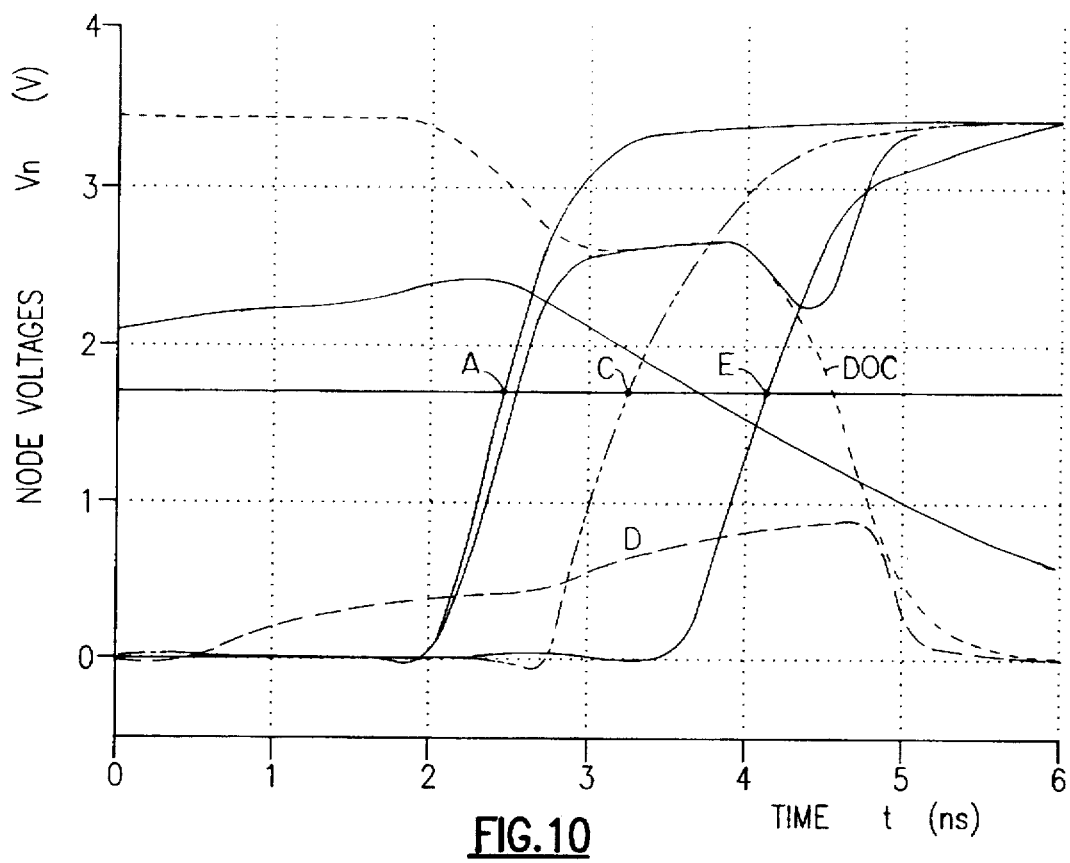
Figure 11:
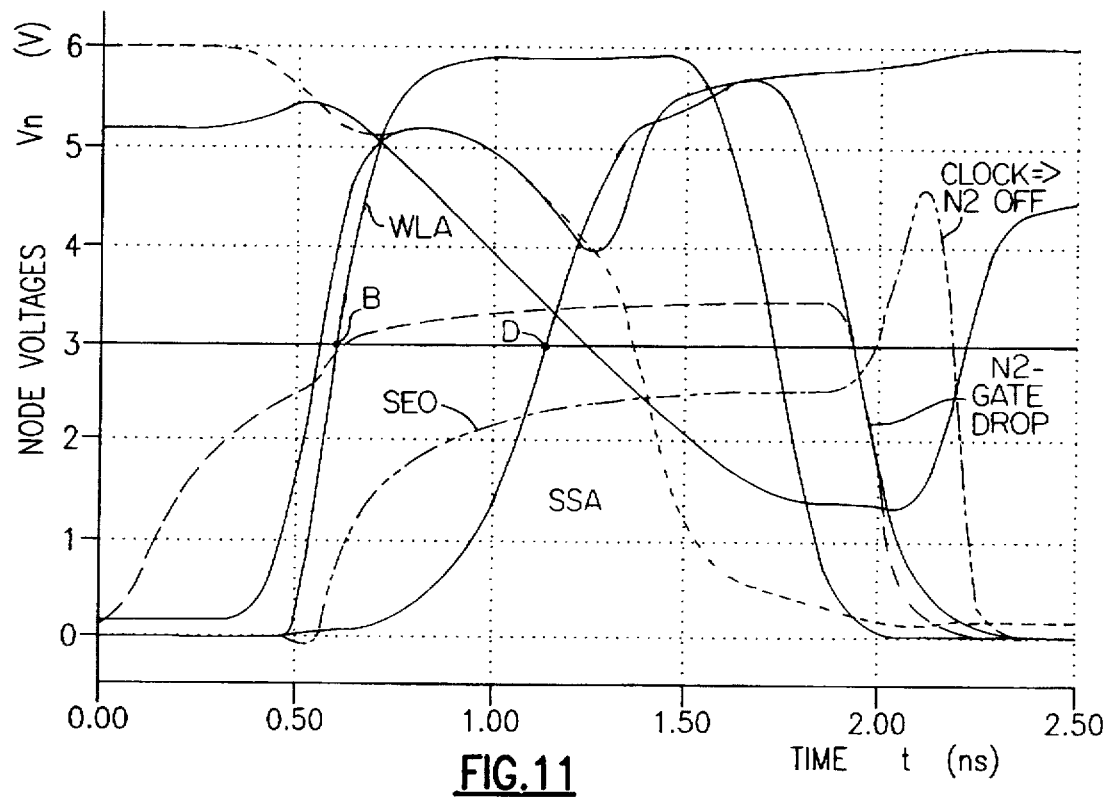

FIG. 10 shows the worst case performance of the herein proposed sensing scheme with voltage dependent timing at minimum supply voltage Vdd=3.42 V (3.6 V–8%), wherein FIG. 11 shows the best case performance of this sensing scheme with voltage dependent timing at maximum screen voltage Vdd=6 V. FIG. 11 shows a significant additional SSA delay of about 250 ps in the high-voltage corner (6 V), as compared to FIG. 9 without voltage-controlled timing. With the conventional scheme, this extra delay of 250 ps required for proper functionality at 6 V would translate into a delay of about four times (=1 ns) in the worst case performance corner at the minimum voltage (3.42 V), thereby increasing the access time by 1 ns (e.g. from 5 to 6 ns).

Thus, for a 128×108-bit two-port SRAM, a worst case access time of about 5 ns (CLK-DO) can be achieved at 3.4 V (Vddmin) with 0.8 µm CMOS and functionality at burn-in (5.1 V) and even at voltage stresses with Vdd=6 V is maintained.

The proposed circuit and method can be used either in processing units which comprise a memory array as discussed above, or in a higher-level storage unit of a data processing system. Due to the advanced data throughput according to the shorter access times for read-out operations in those memory arrays, the performance of the processing units or the processing systems, respectively, is considerably increased.

We claim:

1. A timing delay circuit which comprises delay means (1) for providing an output signal (3) in response to an input signal (2), where said output signal is delayed with respect to said input signal, said delay varying with a supply voltage (Vdd) by which said circuit is powered; and circuit means (78) with a switching threshold (21) which are connected to said output of said delay means for receiving said output signal (3), said timing delay circuit characterized by switching means (14, 34, 43, 70) for providing a current sink element (NFET 14, 34, or 70) or a current source element (PFET 43) coupled to the output of the delay means (1), said current sink element sinking current from said output signal (3) upon a rising edge of said output signal (3) of said delay means (1) and said current source element sourcing current to said output signal (3) of said delay means upon a falling edge of said output signal (3) of said delay means (1), said switching means being enabled by an adjustable control voltage (71) which varies in proportion to said supply voltage, said switching means being enabled if said supply voltage exceeds a minimum value and said switching means being disabled if said supply voltage is below said minimum value , said enabled switching means further delaying the output signal (3) of the delay means by increasing the time required for the rising or falling edge of said output signal to respectively rise or fall to the switching threshold of the circuit means.

2. Delay circuit as in claim 1, further characterized by means (72) for generating said control voltage (71) dependent on said supply voltage (Vdd).

3. A timing delay circuit which comprises delay means (1) for providing an output signal (3) in response to an input signal (2), where said output signal is delayed with respect to said input signal, said delay varying with a supply voltage (Vdd) by which said circuit is powered; and circuit means (78) with a switching threshold (21) which are connected to said output of said delay means for receiving said output signal (3), said timing delay circuit characterized by switching means (14, 34, 43, 70) for providing a current mink element (NFET 14, 34, or 70) or a current source element (pFET 43) coupled to the output of the delay means (1), said current sink element sinking current from said output signal (3) upon a rising edge of said output signal (3) of said delay means (1) and said current source element sourcing current to said output signal (3) of said delay means upon a falling edge of said output signal (3) of said delay means (1), said switching means being enabled by an adjustable control voltage (71) which is dependent upon said supply voltage, said enabled switching means further delaying said output signal (3) of said delay means, and wherein said timing delay circuit further includes clock means (82) for providing a clock signal to said switching means for controlling the level of the adjustable control voltage of said switching means.

4. Delay circuit as in claims 3, characterized in that said delay means comprises an inverting or a non-inverting inverter delay chain (1, 11, 31–33, 67, 68) and that said switching means (14, 34, 43, 70) is connected to an output (FIGS. 4a, b) of a stage of said delay chain depending on whether the output signal of said stage is rising or falling.

5. A delay circuit as in claim 3 characterized in that said current sink element (14, 34, 70) comprises a NMOS field effect transistor (70) with said adjustable control voltage applied to a gate (71) of said transistor, said control voltage being close to a threshold voltage for said NMOS transistor, if the level of said supply voltage is at a determined minimum level for said supply voltage, and said control voltage being larger than said threshold voltage, if the level of said supply voltage is greater than the determined minimum level for said supply voltage.

6. A delay circuit as in claim 3 characterized in that said current source element (43) comprises a PMOS field effect transistor (43) with said adjustable control voltage applied to a gate of said transistor, said control voltage being close to the difference of said supply voltage and said threshold voltage of said PMOS transistor, if the level of said supply voltage is at a determined minimum level for said supply voltage, and said control voltage being smaller than said difference, if the level of said supply voltage is less than the determined minimum level for said supply voltage.

7. Delay circuit as in claim 2, characterized in that said means (72) for generating said control voltage comprises a stack of n diodes (72).

8. Delay circuit as in claim 7, characterized in that said stack of diodes (72) comprises a series connection of n NMOS field effect transistors, where each of said transistors has a gate and a drain interconnected to form a diode.

9. In a timing delay circuit comprising delay means (1) for providing an output signal (3) in response to an input signal (2), where said output signal is delayed with respect to said input signal, said delay varying with a supply voltage (Vdd) by which said circuit is powered;

circuit means (78) with a switching threshold (21) which are connected to said output of said delay means; and switching means (14, 34, 43, 70) for providing a current sink/source dependent on a rising/falling edge of said output signal, which is connected to said output of said delay means, and which is switched by a control voltage (71) dependent on said supply voltage;

a method for precisely adjusting said timing delay dependent on said supply voltage, characterized by the steps of:

determining a threshold voltage for said switching means; and switching said switching means dependent on whether said supply voltage exceeds a minimum value and whether said control voltage becomes larger than said threshold voltage (FIG. 3).

10. In a timing delay circuit comprising delay means (1) for providing an output signal (3) in response to an input signal (2), where said output signal is delayed with respect to said input signal, said delay varying with a supply voltage (Vdd) by which said circuit is powered;

circuit means (78) with a switching threshold (21) which are connected to said output of said delay means; and switching means (14, 34, 43, 70) for providing a current sink/source dependent on a rising/falling edge of said output signal, which is connected to said output of said delay means, and which is switched by a control voltage (71) dependent on said supply voltage;

a method for precisely adjusting said timing delay dependent on said supply voltage, characterized by the steps of:

determining a threshold voltage for said switching means; and switching said switching means dependent on whether said supply voltage exceeds a minimum value and whether said control voltage becomes smaller than the difference between said supply voltage and said threshold voltage (FIG. 3).

11. A timing delay circuit as in claim 3 in a high speed memory array, characterized in that said circuit means includes a sense amplifier (78) for sensing and amplifying a signal which is delivered by a memory cell (63) of said memory array when selected for a read operation;

wherein said delay means is triggered from a sample word line(80) and provides a set signal (SSA) for said sense amplifier; and wherein said set signal is delayed by said switching means when said supply voltage exceeds a nominal operation voltage level.

12. A timing delay circuit as in claim 11 for single-ended sensing in a fast multi-port SRAM.

13. A timing delay circuit as in claim 11 characterized in that said timing delay circuit further comprises a 2-way NAND gate (64) coupled to the output of said delay means for receiving said output signal (3) said NAND gate having a set input and a reset input and an output coupled to an inverting buffer (65) for driving a control line for said sense amplifier (78).

14. A timing delay circuit as in claim 13, characterized in that said set input of said NAND gate (64) is connected to a non-inverting delay chain (67, 68) of inverters which is triggered from said sample word line (80), and said reset input of said NAND gate which initiates deactivation of said sense amplifier signal is fed by a second inverter chain.

15. A timing delay circuit as in claim 11, characterized in that a gate voltage (71) of said current element sink/source (70) is adjusted by a number of NMOS diodes (72) being inserted between said supply voltage and a gate of said current element sink/source.

16. A timing delay circuit as in claim 11, characterized in that at said nominal supply voltage said current sink element remains just turned off.

17. A timing delay circuit as in claim 14, characterized in that said current sink element (70) comprises the same current drive capability as a PMOS transistor at the output of an inverter stage (68), where said current sink element is connected.

* * * * *

UNITED STATES PATENT AND TRADEMARK OFFICE
CERTIFICATE OF CORRECTION

PATENT NO. : 5,796,284
DATED : August 18, 1998
INVENTOR(S) : Clemen et al.

It is certified that error appears in the above-identified patent and that said Letters Patent is hereby corrected as shown below:

Column 8, line 18, "mink" should be --sink--

Signed and Sealed this

Twenty-second Day of June, 1999

Attest:

Q. TODD DICKINSON

*Attesting Officer*    *Acting Commissioner of Patents and Trademarks*